United States Patent

Bylsma et al.

[11] Patent Number: 6,064,527
[45] Date of Patent: May 16, 2000

[54] SEMICONDUCTOR LASER ASSEMBLY WITH REDUCED RIPPLE

[75] Inventors: Richard Bendicks Bylsma, Allentown; Mindaugas Fernand Dautartas, Alburtis; Carl Edward Gaebe, Fleetwood; Rudolf Feodor Kazarinov, Bethlehem Township, Northampton County; Lisa Ann Peterson, Brecknock Township, Berks County; Julie Sheridan-Eng, Upper Macungie Township, Lehigh County; Gleb E. Shtengel, Upper Milford Township, Lehigh County, all of Pa.

[73] Assignee: Lucent Technologies Inc., Murray Hill, N.J.

[21] Appl. No.: 09/140,269

[22] Filed: Aug. 26, 1998

[51] Int. Cl.[7] .............................. G02B 27/10; G02B 3/00; G02B 3/02

[52] U.S. Cl. .......................... 359/618; 359/664; 359/719
[58] Field of Search .................................... 359/618, 664, 359/719; 385/35

[56] References Cited

U.S. PATENT DOCUMENTS

| 4,875,750 | 10/1989 | Spaeth et al. | 350/96.18 |
| 4,983,555 | 1/1991 | Roy et al. | 501/120 |
| 5,025,448 | 6/1991 | Sudo et al. | 372/32 |
| 5,898,191 | 4/1999 | Kwon et al. | 275/95 |

*Primary Examiner*—Georgia Epps
*Assistant Examiner*—Saeed Seyrafi
*Attorney, Agent, or Firm*—Lester H. Birnbaum

[57] ABSTRACT

The invention is a laser assembly with reduced distortion ripple. The assembly includes a spherical lens for collimating light emitted from the laser. The lens is made of a material which attenuates scattered light which is the source of ripple without appreciably affecting the main beam.

4 Claims, 1 Drawing Sheet

SEMICONDUCTOR LASER ASSEMBLY WITH REDUCED RIPPLE

FIELD OD THE INVENTION

This invention relates to semiconductor laser assemblies.

BACKGROUND OF THE INVENTION

Analog semiconductor lasers, such as InP Distributed Feedback (DFB) lasers, are finding increasing use in cable TV transmission systems. In one design, the laser is mounted on the surface of a silicon substrate, and the light from the laser is focused onto an optical fiber by means of a spherical lens which is mounted in a cavity in the silicon substrate. (See, e.g., U.S. patent application of Anigbo, Ser. No. 60/00916, filed Dec. 22, 1995, which is incorporated by reference herein.)

One of the problems associated with fabricating such devices is to keep distortion ripple at a minimum. The "distortion ripple" is defined as the variation of the values of the composite second order distortions and the composite triple beat distortions. Generally, it is desired to keep the distortion ripple at or better than 4 dB over a laser temperature variation of 2 deg C., which is the typical temperature variation of the laser in the package.

Recently, it has been suggested that distortion ripple can be reduced by making at least a portion of the spherical lens optically asymmetric to prevent multiple reflections of scattered light within the lens. (See U.S. patent application of Bylsma et al, Ser. No. 09/069109, filed Apr. 29, 1998, which is incorporated by reference herein.)

SUMMARY OF THE INVENTION

The invention is a laser assembly which includes a semiconductor laser and a spherical lens positioned with respect to the laser to receive light emitted therefrom. The lens comprises a material which absorbs a portion of the laser light so as to attenuate any multiply scattered light within the lens.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
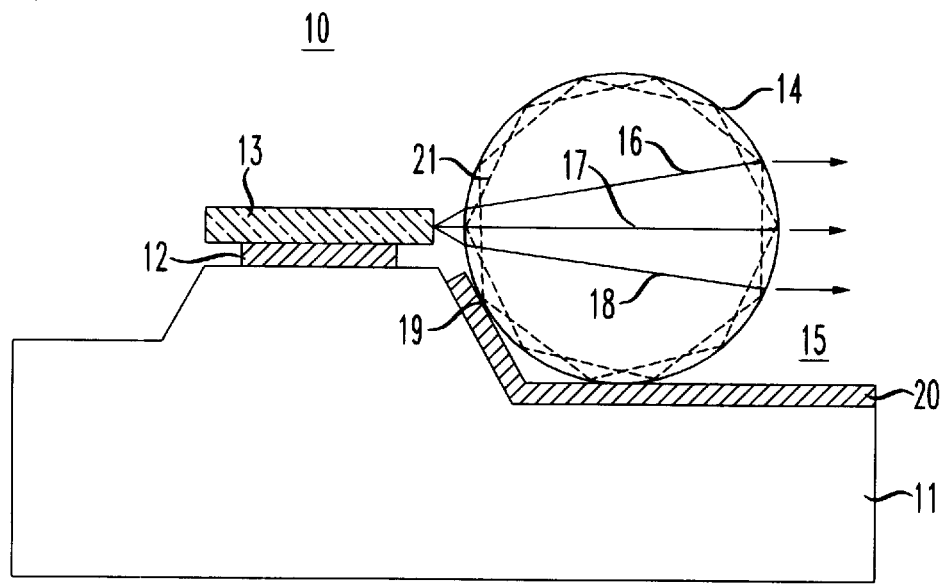
FIG. 1 is a cross sectional view of a portion of a laser assembly in accordance with a prior art design illustrating a possible cause of distortion ripple.

FIG. 1 illustrates a portion of an optical assembly, 10, in accordance with the prior art. The assembly includes a substrate, 11, which is typically silicon. A bonding pad, 12, is formed on a major surface of the substrate. The pad is typically Ti/Pt/Au. Mounted on top of the pad, 12, is a semiconductor laser, 13, which in this example is a 1.3 micron InP DFB laser, but could be any semiconductor analog laser. A spherical lens, 14, is mounted in a cavity, 15, etched in the surface of the substrate. The lens is typically made of $MgAl_2O_3$, YAG, or glass, and is positioned with respect to the laser, 13, to collimate the light from the facing edge of the laser as indicated schematically by the rays 16–18. (For a more detailed discussion of an optical assembly formed on a silicon substrate, see, for example, U.S. Patent Application of Anigbo, cited above.) The lens is bonded to a layer, 20, of aluminum formed on the surfaces of the cavity, 15, according to known techniques to form a three point mechanical contact, one of which is shown as 19, the other two being formed with the side walls of the cavity, 15, which are not shown in this view. (See, for example, U.S. Pat. No. 5,178,319 issued to Coucoulas, which is incorporated by reference herein.)

Applicants have discovered that a source of distortion ripple in such assemblies is scattered light within the lens, 14, as illustrated, for example by the dotted line, 21. Applicants theorize that since the lens is optically symmetrical, the scattered light is multiply reflected within the lens, 14, and gains in intensity due to constructive interference. The scattered light may then exit the lens at a point which interferes with the main beam, 16–18. Alternatively, the scattered light may exit at any point on the lens, 14, but the intensity of such light may be frequency dependent and thereby cause a nonlinearity in the intensity of the main beam at certain optical frequencies.

Figure 2:
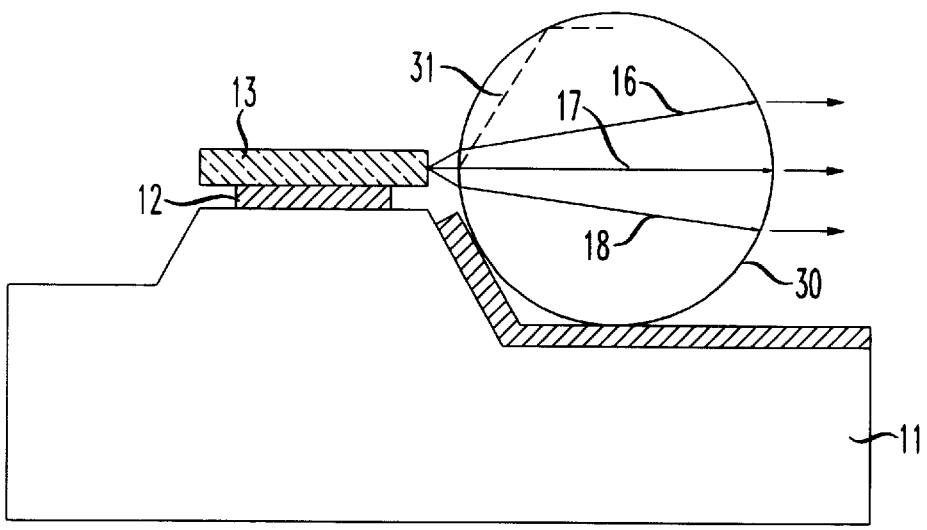
FIG. 2 is a cross sectional view of a portion of a laser assembly in accordance with an embodiment of the invention illustrating reduction of distortion ripple.

In accordance with a feature of the invention, as illustrated in FIG. 2, the normally highly transparent spherical lens (14 of FIG. 1) is replaced by a lens, 30, which will absorb a portion of the light emitted by the laser, 13. The amount of loss introduced by the lens, 30, is preferably small enough to not appreciably reduce the intensity of the main optical beam, as represented by arrows 16,17, and 18, as before. However, since the cavity length of the multiply reflected beam, 31, is typically much greater than that of the main beam (typically 20 mm), a small amount of loss is sufficient to attenuate the multiply reflected beam and thereby reduce ripple.

In one example, the lens, 30, can be a Spinel lens with an amount of Fe doping selected to achieve sufficient attenuation of the scattered beam, 31, to reduce ripple. For example, Fe doping in an amount of 0.5 percent will achieve an attenuation of approximately 0.2 dB. This, in turn, will reduce ripple down to approximately 3 dB. Doping in general, will be in tile range 25–2.5 percent. In general, any lens can be used as long as it introduces a loss within the range 0.1–1 dB. Loss below this limit will not be sufficient to affect the scattered light, and loss above this value will tend to have an adverse effect on the main beam.

Various modifications of the invention will become apparent to those skilled in the art. For example, other materials for the lens may be employed, for example Spinel, or YAG or Ruby and other types of dopants, such as Cr, may be used, as long as the appropriate amount of loss is supplied.

What is claimed is:

1. A laser assembly comprising: a semiconductor laser, and a spherical lens positioned with respect to the laser to receive light emitted therefrom, the lens comprising a material which provides a loss of light within the range 0.1 to 1 dB, so as to attenuate any multiply scattered light within the lens.

2. The assembly according to claim 1 wherein the lens comprises Spinel with an amount of Fe doping within the range 0.25–2.5 percent.

3. The assembly according to claim 1 wherein the laser and lens are mounted on a semiconductor substrate.

4. The assembly according to claim 1 wherein light from the lens exhibits distortion ripple at or better than 4 dB over a laser temperature of 2 deg C.

* * * * *